(12) United States Patent
Choi et al.

(10) Patent No.: US 8,450,737 B2
(45) Date of Patent: May 28, 2013

(54) THIN FILM TRANSISTOR ARRAY PANEL AND METHOD FOR MANUFACTURING THE SAME

(75) Inventors: Shin-Il Choi, Hwaseong-si (KR); Yu-Gwang Jeong, Yongin-si (KR); Ki-Yeup Lee, Yongin-si (KR); Dong-Ju Yang, Seoul (KR); Jean-Ho Song, Seoul (KR)

(73) Assignee: Samsung Display Co., Ltd. (KR)

( * ) Notice: Subject to any disclaimer, the term of this patent is extended or adjusted under 35 U.S.C. 154(b) by 458 days.

(21) Appl. No.: 12/784,376

(22) Filed: May 20, 2010

(65) Prior Publication Data

US 2011/0089421 A1    Apr. 21, 2011

(30) Foreign Application Priority Data

Oct. 15, 2009    (KR) .................. 10-2009-0098338

(51) Int. Cl.
    *H01L 31/00*    (2006.01)
(52) U.S. Cl.
    USPC .............. 257/59; 257/E21.561; 257/E29.291; 257/E27.111; 438/151; 438/166; 438/30
(58) Field of Classification Search
    USPC ........ 438/30, 151–166; 257/59, 72, E21.561, 257/E29.291, E27.111, E29.294, E21.7
    See application file for complete search history.

(56) References Cited

U.S. PATENT DOCUMENTS

| | | | | |
|---|---|---|---|---|
| 6,831,018 B2* | 12/2004 | Kanegae | ................. | 438/706 |
| 6,870,187 B2* | 3/2005 | Chung | ................. | 257/59 |
| 7,341,943 B2* | 3/2008 | Yeh et al. | ................. | 438/677 |
| 2002/0074549 A1* | 6/2002 | Park et al. | ................. | 257/59 |
| 2004/0262569 A1* | 12/2004 | Cho et al. | ................. | 252/79.1 |
| 2005/0041170 A1* | 2/2005 | Chae | ................. | 349/43 |
| 2005/0127360 A1* | 6/2005 | Uchida | ................. | 257/59 |
| 2005/0270451 A1* | 12/2005 | Ahn | ................. | 349/114 |
| 2006/0001789 A1* | 1/2006 | Ahn | ................. | 349/42 |
| 2006/0003576 A1* | 1/2006 | Yeh et al. | ................. | 438/638 |
| 2006/0145159 A1* | 7/2006 | Yokoyama et al. | ................. | 257/72 |
| 2006/0160260 A1* | 7/2006 | Cho et al. | ................. | 438/30 |
| 2006/0178008 A1* | 8/2006 | Yeh et al. | ................. | 438/687 |
| 2006/0243976 A1* | 11/2006 | Shin | ................. | 257/59 |
| 2006/0249732 A1* | 11/2006 | Shirasaki et al. | ................. | 257/59 |
| 2007/0001588 A1* | 1/2007 | Boroson et al. | ................. | 313/504 |
| 2007/0046847 A1* | 3/2007 | Lee et al. | ................. | 349/43 |
| 2007/0096100 A1* | 5/2007 | Lee et al. | ................. | 257/59 |
| 2007/0103624 A1* | 5/2007 | Kim et al. | ................. | 349/114 |
| 2007/0109483 A1* | 5/2007 | Jeoung et al. | ................. | 349/149 |
| 2007/0275512 A1* | 11/2007 | Jee et al. | ................. | 438/149 |
| 2008/0020581 A1* | 1/2008 | Liu | ................. | 438/706 |

(Continued)

FOREIGN PATENT DOCUMENTS

JP    2008304830 A    * 12/2008

*Primary Examiner* — N Drew Richards
*Assistant Examiner* — Ankush Singal
(74) *Attorney, Agent, or Firm* — Innovation Counsel LLP

(57) ABSTRACT

A thin film transistor array panel includes: a substrate; a signal line disposed on the substrate and including copper (Cu); a passivation layer disposed on the signal line and having a contact hole exposing a portion of the signal line; and a conductive layer disposed on the passivation layer and connected to the portion of the signal line through the contact hole, wherein the passivation layer includes an organic passivation layer including an organic insulator that does not include sulfur, and a method of manufacturing the thin film transistor prevents formation of foreign particles on the signal line.

18 Claims, 19 Drawing Sheets

U.S. PATENT DOCUMENTS

| | | | |
|---|---|---|---|
| 2008/0030119 A1* | 2/2008 | Ito et al. | 313/483 |
| 2008/0143912 A1* | 6/2008 | Kim | 349/48 |
| 2008/0237582 A1* | 10/2008 | Cho et al. | 257/40 |
| 2008/0265293 A1* | 10/2008 | Lee et al. | 257/288 |
| 2009/0291517 A1* | 11/2009 | Ahn | 438/30 |
| 2010/0006852 A1* | 1/2010 | Park et al. | 257/72 |
| 2010/0073622 A1* | 3/2010 | Ahn | 349/190 |
| 2010/0315318 A1* | 12/2010 | Lee et al. | 345/76 |

* cited by examiner

THIN FILM TRANSISTOR ARRAY PANEL AND METHOD FOR MANUFACTURING THE SAME

CROSS-REFERENCE TO RELATED APPLICATION

This application claims priority to and the benefit of Korean Patent Application No. 10-2009-0098338 filed in the Korean Intellectual Property Office on Oct. 15, 2009, the entire contents of which are incorporated herein by reference.

BACKGROUND OF THE INVENTION (a) Field of the Invention

The present invention relates to a thin film transistor array panel and a manufacturing method thereof.

(b) Description of the Related Art

A thin film transistor is used as a switching element to independently drive a pixel in a flat display device such as a liquid crystal display or an organic light emitting device. A flat display devices will include a thin film transistor array panel in which each thin film transistor is connected to signal lines, such as a scanning signal line (or a gate line) for transmitting a scanning signal to the thin film transistor, and a data line for transmitting a data signal to the thin film transistor. Each thin film transistor is also connected to a pixel electrode.

The signal lines extend along the length of the thin film transistor array panel, such that it is necessary to form the signal line with a material having low resistivity. Accordingly, copper (Cu), which has a low resistivity is used as the material to form the signal line.

A passivation layer is typically deposited on the signal line, such as the data line, and the passivation layer has a contact hole so that the underlying signal line can contact a different layer that is over the passivation layer. The passivation layer may be made of an organic layer or an inorganic layer. When the passivation layer is made of an inorganic layer, a photosensitive film is coated on the inorganic layer to form the contact hole, while when the passivation layer is made of an organic layer, an ashing process using oxygen gas is further required after forming the contact hole by using the organic layer as a mask.

However, in forming the contact hole in the passivation layer, or performing the ashing process, foreign particles may be generated at the surface of the signal line which include copper, and the color of the signal line is changed, indicating contamination of the surface, such that the contact characteristic is deteriorated.

The above information disclosed in this Background section is only for enhancement of understanding of the background of the invention and therefore it may contain information that does not form the prior art that is already known to a person of ordinary skill in the art.

SUMMARY OF THE INVENTION

A thin film transistor array panel includes: a substrate; a signal line disposed on the substrate that includes copper (Cu); a passivation layer disposed on the signal line and having a contact hole exposing a portion of the signal line; and a conductive layer disposed on the passivation layer and connected to the portion of the signal line through the contact hole, wherein the passivation layer includes an organic passivation layer including an organic insulator that does not include sulfur.

The organic passivation layer may have negative photosensitivity.

The passivation layer may further include an inorganic passivation layer disposed under the organic passivation layer and including an inorganic insulator.

The signal line may include a lower conductive layer and an upper conductive layer, the upper conductive layer may include copper, and the lower conductive layer may include at least one of titanium (Ti), tantalum (Ta), nickel (Ni), molybdenum (Mo), neodymium (Nb), tungsten (W), indium (In), tin (Sn), gold (Au), and chromium (Cr).

A gate insulating layer formed on the substrate may be further included, the signal line may include a gate line disposed under the gate insulating layer, and the contact hole may be extended through the gate insulating layer.

A manufacturing method of a thin film transistor array panel includes: forming a signal line that includes copper on a substrate; depositing a first passivation layer on the signal line; coating an organic material layer including an organic material having photosensitivity on the first passivation layer; irradiating light to the organic material layer through a mask to pattern the organic material layer; forming a contact hole exposing a portion of the signal line in the first passivation layer by using the patterned organic material layer as an etching mask; and forming a conductive layer connected to the signal line through the contact hole, wherein the contact hole is formed by using a first etching gas including a fluorine-based gas and a second etching gas including oxygen gas, and the flow ratio (sccm) of the first etching gas to the second etching gas is more than 1/7.

The first etching gas may include sulfur hexafluoride ($SF_6$).

The signal line may include a lower conductive layer and an upper conductive layer, the upper conductive layer may include copper, and the lower conductive layer may include at least one of titanium (Ti), tantalum (Ta), nickel (Ni), molybdenum (Mo), neodymium (Nb), tungsten (W), indium (In), tin (Sn), gold (Au), and chromium (Cr).

The method may further include removing the organic material layer.

The organic material layer may form a second passivation layer disposed under the conductive layer.

The photomask may include a transparent region through which light is transmitted, an opaque region at which light is blocked, and a translucent region through which light is partially transmitted. After the patterning of the organic material layer, a first portion of the organic material layer corresponding to the translucent region of the photomask may have a thinner thickness than the remaining organic material layer.

The method may further include ashing the organic material layer to remove the first portion.

The ashing to remove the first portion may comprise using oxygen plasma gas.

The method may further include cleaning by using a cleaning material including a stripping agent or hydrogen fluoride (HF) after the ashing to remove the first portion.

A manufacturing method of a thin film transistor array panel includes: forming a signal line that includes copper on a substrate; depositing a first passivation layer on the signal line; coating an organic material layer including an organic material having photosensitivity on the first passivation layer; irradiating light to the organic material layer through a mask to pattern the organic material layer; forming a contact hole exposing a portion of the signal line in the first passivation layer by using the patterned organic material layer as an etching mask; and forming a conductive layer connected to the signal line through the contact hole, wherein the forming of the contact hole is executed in a chamber having a pressure of a plasma gas of equal to or more than 50 mT and equal to or less than 150 mT.

A manufacturing method of a thin film transistor array panel includes: forming a signal line that includes copper on a substrate; depositing a first passivation layer on the signal line; coating an organic material layer including an organic material having photosensitivity on the first passivation layer; irradiating light to the organic material layer through a mask to pattern the organic material layer; forming a contact hole exposing a portion of the signal line in the first passivation layer by using the patterned organic material layer as an etching mask; and forming a conductive layer connected to the signal line through the contact hole, wherein the forming of the contact hole is executed in a chamber including an electrode for forming a plasma gas, and the electrode is supplied with a source power and a bias power, and a ratio of the bias power to the source power is equal to or less than 3.

A manufacturing method of a thin film transistor array panel includes: forming a signal line that includes copper on a substrate; depositing a first passivation layer on the signal line; coating an organic material layer including an organic material having photosensitivity on the first passivation layer; irradiating light to the organic material layer through a mask to pattern the organic material layer; forming a contact hole exposing a portion of the signal line in the first passivation layer by using the patterned organic material layer as an etching mask; ashing to remove a portion of the organic material layer; cleaning the exposed portion of the signal line by using a cleaning material including a stripping agent or hydrogen fluoride (HF), and forming a conductive layer connected to the signal line through the contact hole.

The ashing may comprise using oxygen plasma gas.

DESCRIPTION OF REFERENCE NUMERALS INDICATING PRIMARY ELEMENTS IN THE DRAWINGS

Figure 1:
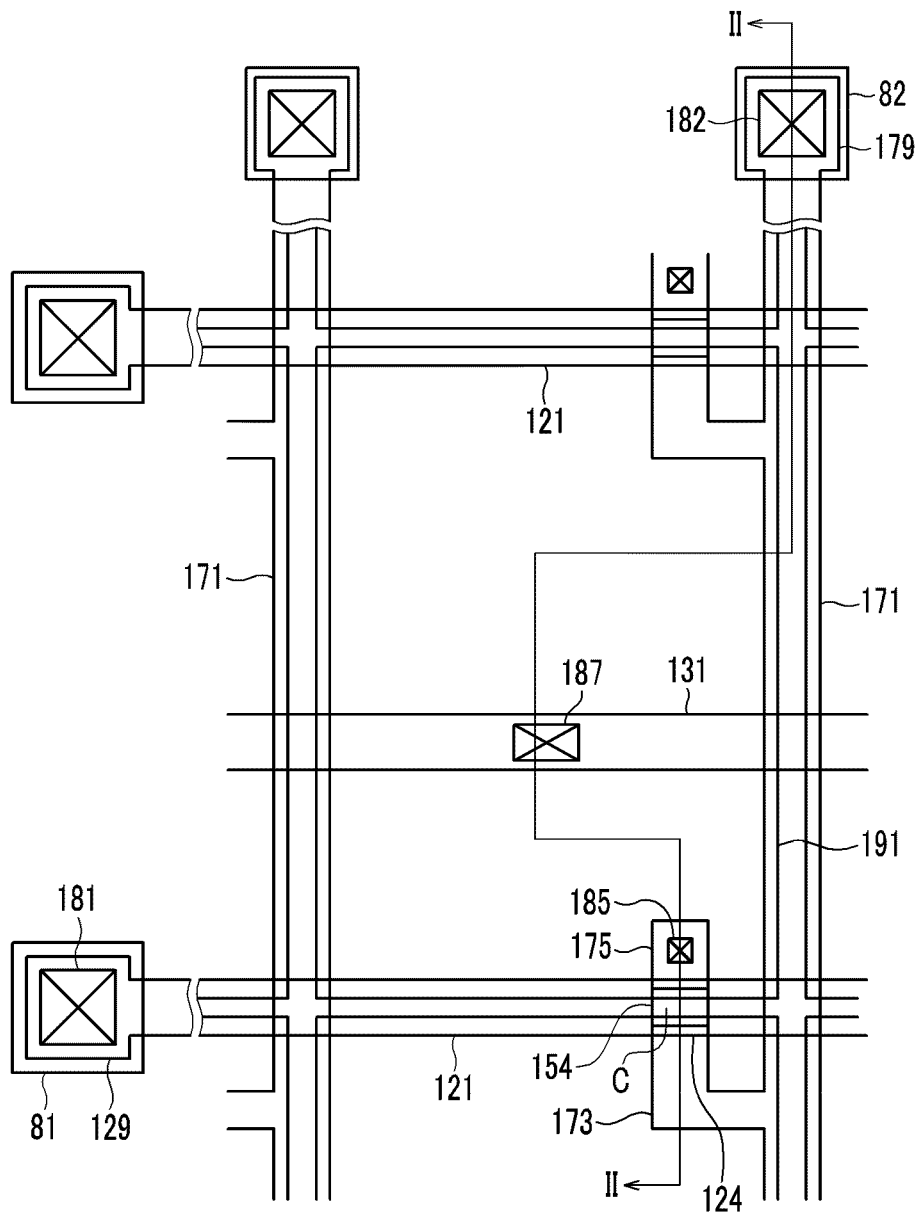
FIG. 1 is a layout view of a thin film transistor array panel according to an exemplary embodiment.

| | |
|---|---|
| 50: | photosensitive film |
| 81, 82: | contact assistants |
| 110: | substrate |
| 121, 129: | gate line |
| 124: | gate electrode |
| 131: | storage electrode line |
| 140: | gate insulating layer |
| 151, 154: | semiconductor |
| 161, 163, 165: | ohmic contact |
| 171, 179: | data line |
| 175: | drain electrode |
| 180, 180p, 180q: | passivation layer |
| 181, 182, 185: | contact hole |
| 187: | opening |
| 191: | pixel electrode |

DETAILED DESCRIPTION OF THE EMBODIMENTS

The present invention will be described more fully hereinafter with reference to the accompanying drawings, in which exemplary embodiments are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a thin film transistor array panel according to an exemplary embodiment will be described with reference to FIG. 1 and FIG. 2.

Figure 2:
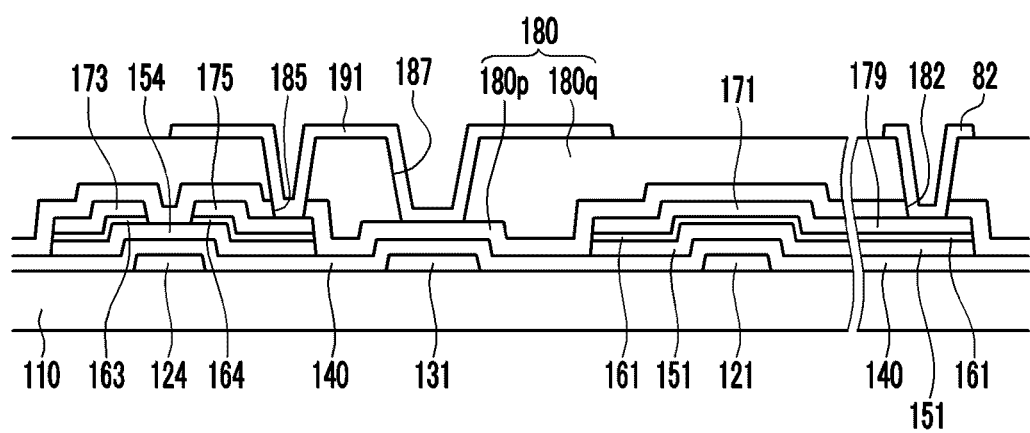
FIG. 2 is a cross-sectional view of the thin film transistor array panel shown in FIG. 1 taken along the line II-II.

FIG. 1 is a layout view of a thin film transistor array panel according to an exemplary embodiment, and FIG. 2 is a cross-sectional view of the thin film transistor array panel shown in FIG. 1 taken along the line II-II.

A gate conductor including a plurality of gate lines 121 and storage electrode lines 131 is formed on an insulation substrate 110 made of glass that includes silicon oxide (SiOx).

The gate lines 121 transmit a gate signal and extend substantially in a row direction, and each gate line 121 includes portions that form a plurality of gate electrodes 124 and a wide end portion 129 for connecting to other layers or a gate driver (not shown).

The storage electrode lines 131 transmit a predetermined voltage such as a common voltage, and extend substantially in a row direction.

The gate conductor may be made of a single layer or multiple layers, and may include copper.

A gate insulating layer 140 that may be made of silicon nitride (SiNx) or silicon oxide (SiOx) is formed on the gate conductor. A gate insulating layer 140 may have a double-layered structure comprising silicon nitride (SiNx) and silicon oxide (SiOx).

A plurality of semiconductor stripes 151 that are made of hydrogenated amorphous silicon (abbreviated as a-Si) or polysilicon are formed on the gate insulating layer 140. The semiconductor stripes 151 may be made of oxide semiconductor comprising at least one of gallium oxide, indium oxide, zinc oxide, and tin oxide. The semiconductor stripes 151 made of oxide semiconductor may include other metal element such as Hf, Ta, etc. to form a multicomponent oxide.

The semiconductor stripes 151 extend mainly in a column direction, under the data lines 171 and have a plurality of protrusions 154 that protrude toward the gate electrodes 124.

A plurality of ohmic contact stripes 161 and islands 164 are formed on the semiconductor stripes 151. The ohmic contact stripes 161 have a plurality of protrusions 163 extending in the same direction as the protrusions 154 of the semiconductor stripes 151. The protrusions 163 and the ohmic contact islands 164 that face each other with respect to the gate electrodes 124 are disposed as a pair on the protrusions 154 of the semiconductor stripes. The ohmic contacts 161 may be made of a material such as n+ hydrogenated a-Si that is heavily doped with an n-type impurity such as phosphorus, or of silicide.

A data conductor including a plurality of data lines 171 and a plurality of drain electrodes 175 is formed on the ohmic contacts 161 and 164.

The data lines 171 transmit the data voltage and extend substantially in the column direction, thereby intersecting the gate lines 121. Each data line 171 includes a plurality of source electrodes 173 that extend toward the gate electrodes 124, and a wide end portion 179 for connecting to another layer or an external driving circuit.

The drain electrodes 175 are separated from the data lines 171 and face the source electrodes 173 with respect to the gate electrodes 124.

The data conductors may be made of a single layer or multiple layers, and may include copper.

A gate electrode 124, a source electrode 173, and a drain electrode 175 form a thin film transistor (TFT) together with the protrusion 154 of the semiconductor stripe 151. A channel C of the TFT is formed in the protrusion 154 between the source electrode 173 and the drain electrode 175.

The protrusions 154 of the semiconductor stripes 151 include exposed portions that are not covered by the ohmic contact layers 161 and 164, or the data lines 171 and the drain electrodes 175 between the source electrodes 173 and the drain electrodes 175. That is, the semiconductor stripes 151, except for the protrusions 154 where the thin film transistors are disposed, have the same planar shape as the data lines 171, the drain electrodes 175, and the underlying ohmic contacts 161 and 164. Also, the ohmic contacts 161 and 164 have substantially the same planar shape as the data lines 171 and the drain electrodes 175, and reduce the contact resistance between the semiconductor stripes 151, and the data lines 171 and the drain electrodes 175.

A passivation layer 180 is formed on the gate insulating layer 140, the data lines 171, the drain electrodes 175, and the exposed protrusions 154 of the semiconductor stripes 151.

The passivation layer 180 includes a lower passivation layer 180p made of an inorganic insulator such as silicon nitride or silicon oxide and an upper passivation layer 180q made of an organic insulator such as a resin. The organic insulator may have a dielectric constant of less than 4.0, may be photosensitive, and may provide a flat surface. Organic insulators that have a dielectric constant of less than 4.0 and are photosensitive and can provide a flat surface are known to those of ordinary skill in the art, and may include, for example, positive organic insulators such as an organic insulator including an alkali soluble resin as its main component, and 2,1-diazonaphtoquinone-4-sulfonic ester or 2,1-diazonaphto-quinone-5-sulfonic ester as its photosensitizer. It is preferable that the alkaki soluble resion, as a resin binder, includes a alkai solvent with a substituent which is crosslinkable with a soluble resin heat cross-linker, where examples of the cross-linker includes a carboxyl group and a hydroxyl group. The upper passivation layer 180q may alternatively be made of an organic insulator having negative photosensitivity or an organic insulator that does not include sulfur (S). Organic insulators having negative photosensitivity are known to those of ordinary skill in the art Organic insulators that do not include sulfur are also known to those of ordinary skill in the art and include, for example, an organic insulator including an alkali soluble resin as its main component, and 2-(4-methoxyphenyl)-4 or a halomethylated triazin derivatives such as 6-Bis(trichloromethyl)-s-triazin,2-(4-methoxynaphthyl)-4,6-Bis(trichloromethyl)-s-triazin,2-(4-ethoxynaphthyl)-4,6-Bis(trichloromethyl)-s-triazin,2-(4-ethoxycarbonyl)-4,6-Bis(trichloromethyl)-s-triazin as its photosensitizer. It is preferable that the alkaki soluble resion, as a resin binder, includes a alkai solvent with a substituent which is crosslinkable with a soluble resin heat cross-linker, where examples of the cross-linker includes a carboxyl group and a hydroxyl group.

The passivation layer 180 has contact holes 185 and 182 respectively exposing the drain electrodes 175 and the wide end portions 179 of the data lines 171. The passivation layer 180 and the gate insulating layer 140 have a contact hole 181 exposing the wide end portions 129 of the gate lines 121.

Also, the upper passivation layer 180q has an opening 187 disposed on a portion of the storage electrode line 131 and exposing the lower passivation layer 180p.

A plurality of pixel electrodes 191 and a plurality of contact assistants 81 and 82 are formed on the passivation layer 180. They may be made of a transparent conductive material such as indium tin oxide (ITO) or indium zinc oxide (IZO), or a reflective metal such as aluminum, silver, chromium, or alloys thereof.

The pixel electrodes 191 are electrically connected to the drain electrodes 175 through the contact holes 185, which also physically connect a portion of the pixel electrode to the drain electrode 175, and receive the data voltages from the drain electrodes 175. The pixel electrode 191 overlaps the storage electrode line 131 at the opening 187 of the upper passivation layer 180q, thereby forming a storage capacitor such that the data voltage applied to the pixel electrode 191 may be maintained after the thin film transistor is turned off.

The contact assistants 81 and 82 cover the wide end portions 129 and 179 of the gate lines 121 and the data lines 171 in the contact holes 181 and 182, thereby being connected thereto. The contact assistants 81 and 82 assist the adhesion of the wide end portions 129 of the gate lines 121 and the wide end portions 179 of the data lines 171 to an external device such as an integrated circuit, so as to protect them.

Next, a manufacturing method of a thin film transistor array panel according to an exemplary embodiment will be described with reference to FIG. 3 to FIG. 11 as well as FIG. 1 and FIG. 2.

Figure 3:
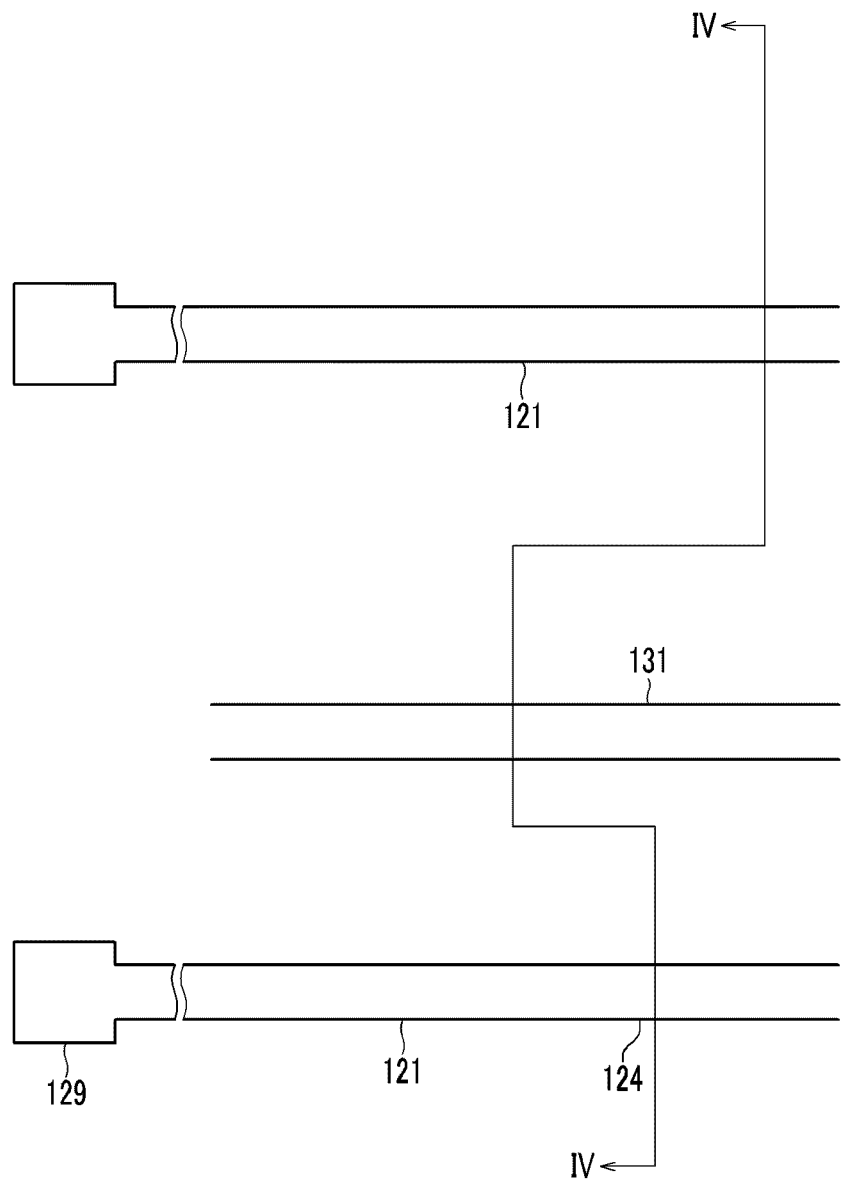
FIG. 3 is a layout view of the thin film transistor array panel shown in FIG. 1 and FIG. 2 at the first step in the manufacturing method according to an exemplary embodiment.
Figure 4:
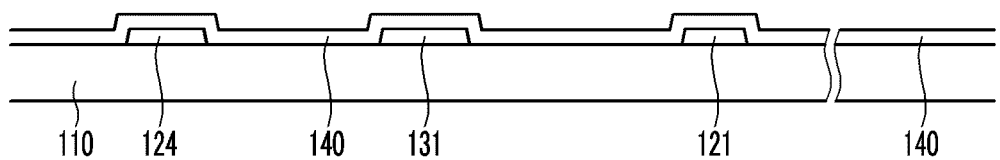
FIG. 4 is a cross-sectional view of the thin film transistor array panel shown in FIG. 3 taken along the line IV-IV.
Figure 5:
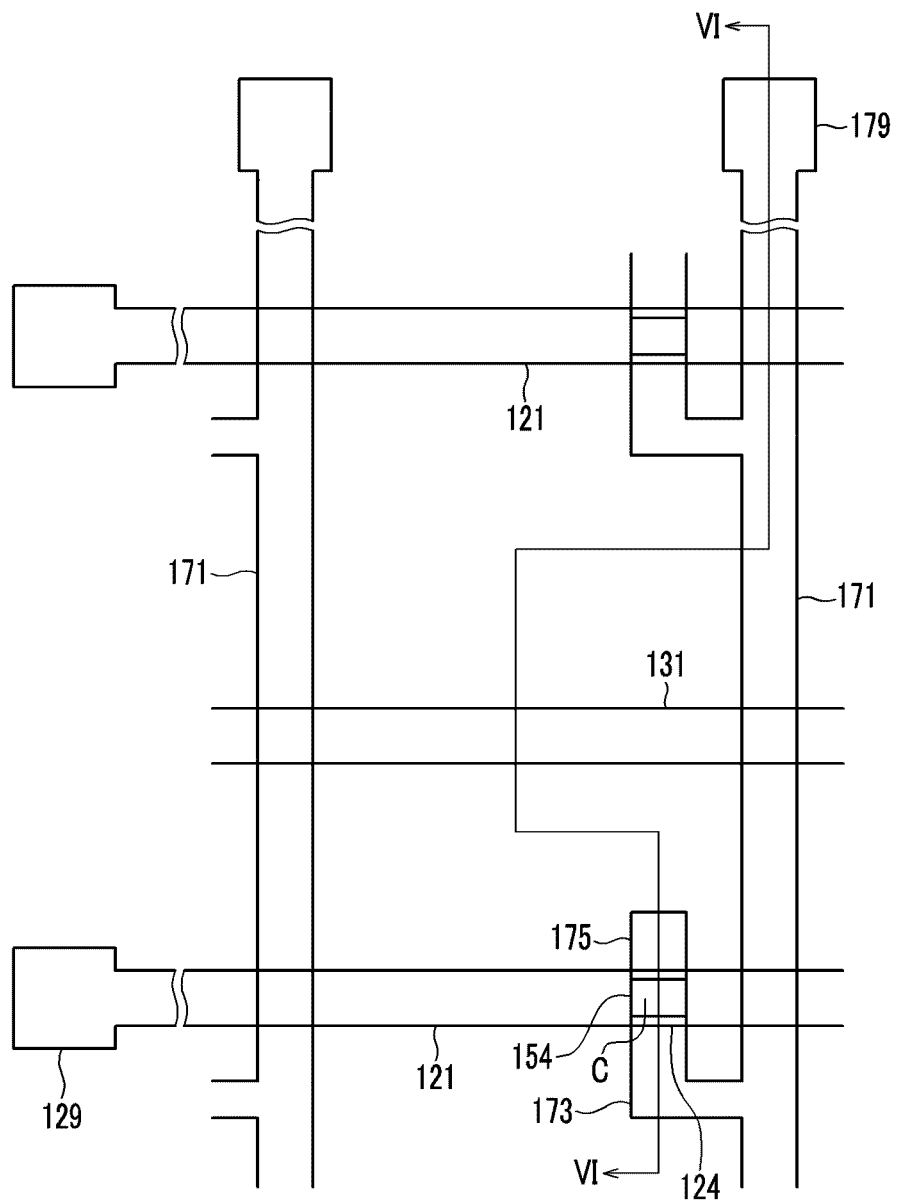
FIG. 5 is a layout view of the thin film transistor array panel shown in FIG. 1 and FIG. 2 at an intermediate step in the manufacturing method according to an exemplary embodiment, showing a step following that of FIG. 3 and FIG. 4.
Figure 6:
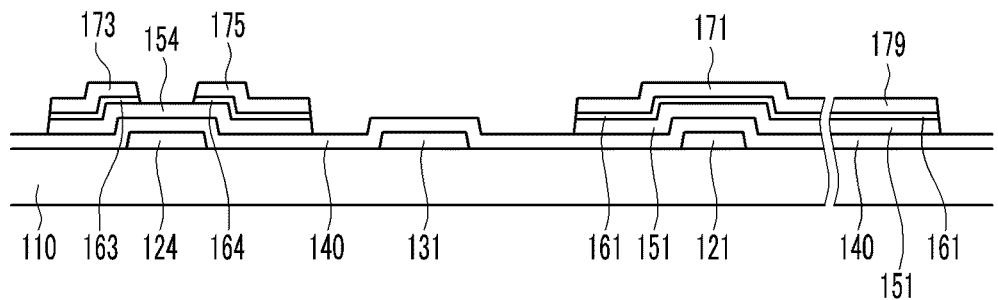
FIG. 6 is a cross-sectional view of the thin film transistor array panel shown in FIG. 5 taken along the line VI-VI.
Figure 7:
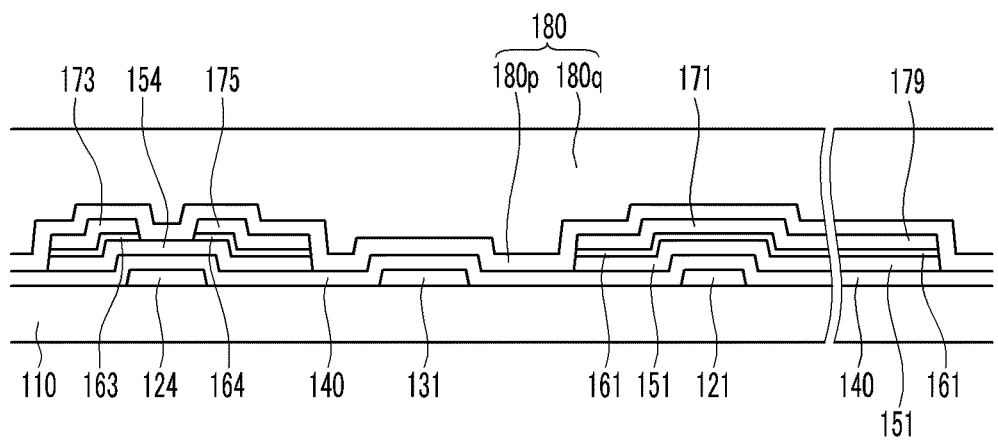
FIG. 7, FIG. 8, and FIG. 9 are cross-sectional views of the thin film transistor array panel shown in FIG. 1 and FIG. 2 at an intermediate step in the manufacturing method according to an exemplary embodiment, sequentially showing a step following that of FIG. 5 and FIG. 6.
Figure 8:
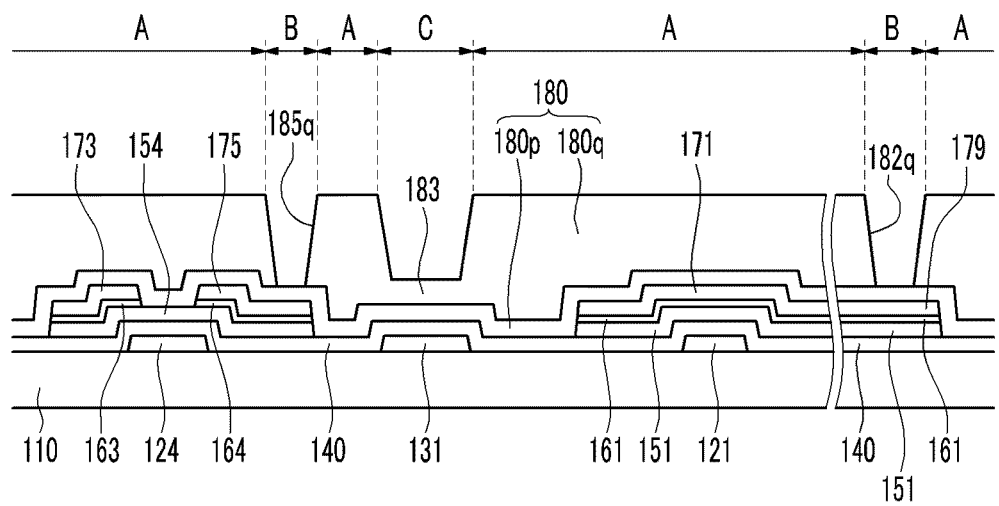
Figure 9:
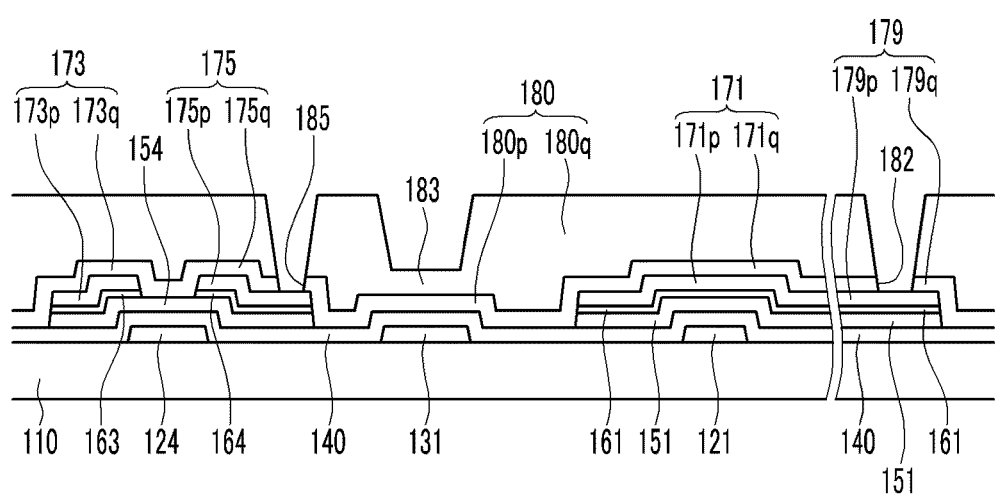
Figure 10:
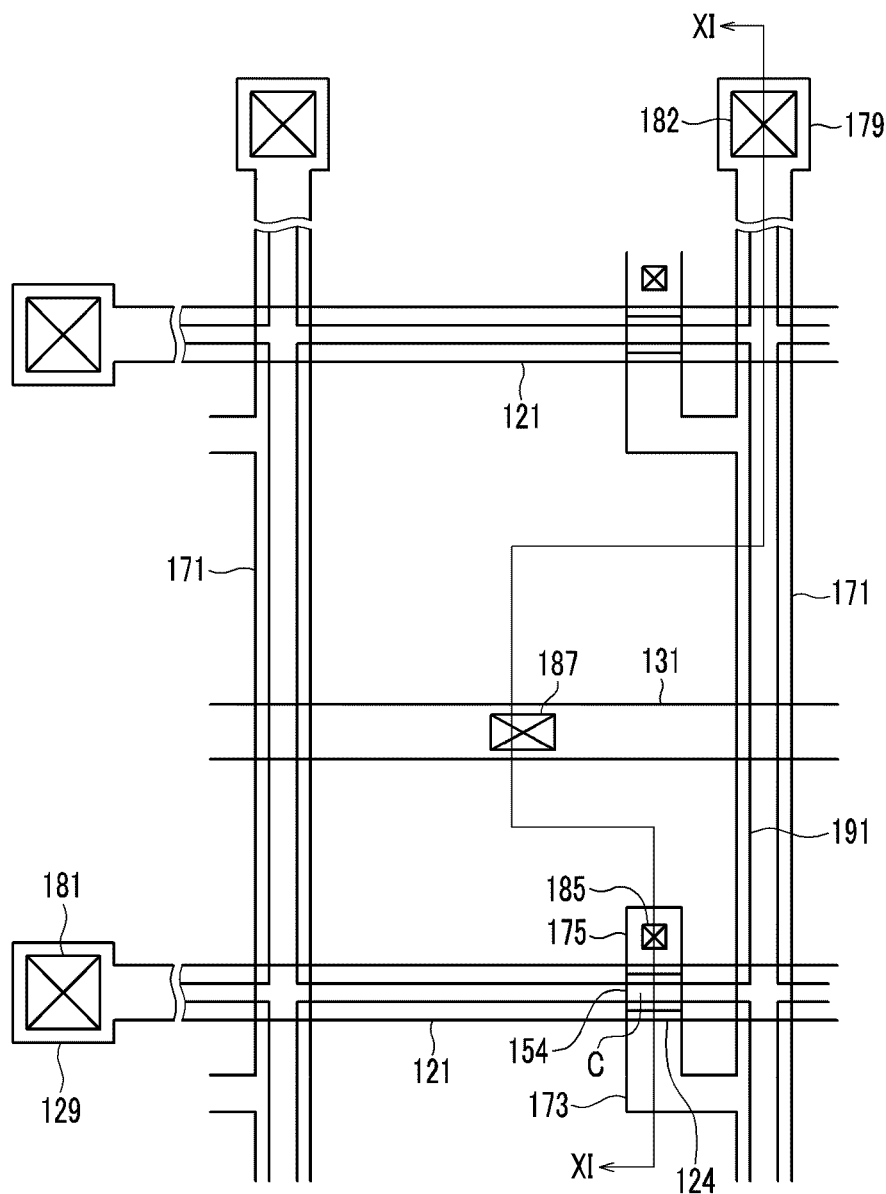
FIG. 10 is a layout view of the thin film transistor array panel shown in FIG. 1 and FIG. 2 at an intermediate step in the manufacturing method according to an exemplary embodiment, showing a step following that of FIG. 9.
Figure 11:
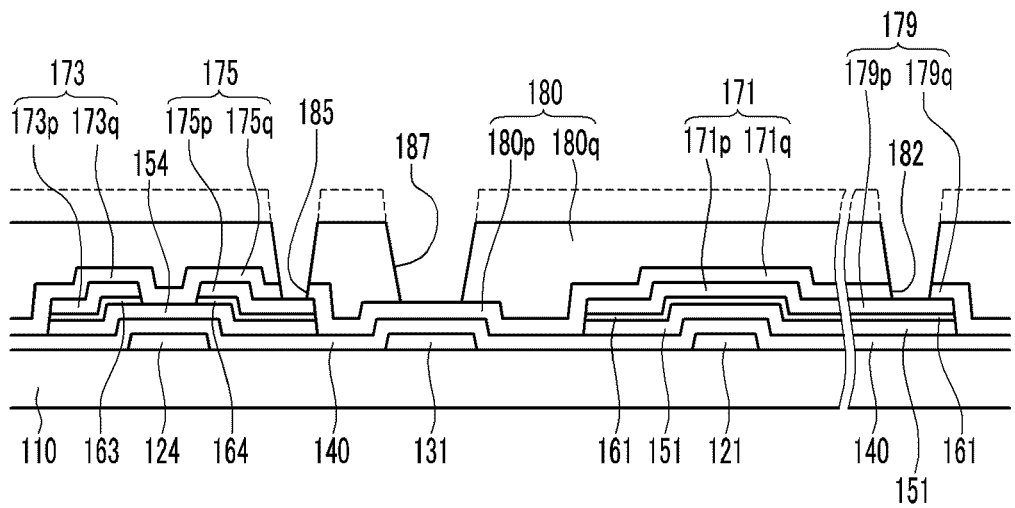
FIG. 11 is a cross-sectional view of the thin film transistor array panel shown in FIG. 10 taken along the line XI-XI.

FIG. 3 is a layout view of the thin film transistor array panel shown in FIG. 1 and FIG. 2 at the first step in the manufacturing method according to an exemplary embodiment, FIG. 4 is a cross-sectional view of the thin film transistor array panel shown in FIG. 3 taken along the line IV-IV, FIG. 5 is a layout view of the thin film transistor array panel shown in FIG. 1 and FIG. 2 at an intermediate step in the manufacturing method according to an exemplary embodiment, showing a step following that of FIG. 3 and FIG. 4, FIG. 6 is a cross-sectional view of the thin film transistor array panel shown in FIG. 5 taken along the line VI-VI, FIG. 7, FIG. 8 and FIG. 9 are cross-sectional views of the thin film transistor array panel shown in FIG. 1 and FIG. 2 at an intermediate step in the manufacturing method according to an exemplary embodiment, sequentially showing a step following that of FIG. 5 and FIG. 6, FIG. 10 is a layout view of the thin film transistor array panel shown in FIG. 1 and FIG. 2 at an intermediate step in the manufacturing method according to an exemplary embodiment, showing a step following that of FIG. 9, and FIG. 11 is a cross-sectional view of the thin film transistor array panel shown in FIG. 10 taken along the line XI-XI.

First, referring to FIG. 3 and FIG. 4, a gate conductive layer (not shown) is deposited by sputtering on an insulation substrate 110 made of transparent glass, and is patterned to form a gate conductor including a plurality of gate lines 121 having gate electrodes 124 and a plurality of storage electrode lines 131.

Next, a gate insulating layer 140 made of silicon nitride or silicon oxide is deposited on the gate conductor.

Next, referring to FIG. 5 and FIG. 6, an intrinsic semiconductor layer (not shown) of amorphous or crystallized silicon, an extrinsic semiconductor layer (not shown) doped with an impurity, and a data conductive layer (not shown) including copper are sequentially deposited on the gate insulating layer 140 and patterned by a photolithography process using a photosensitive film to form a data conductor that includes a plurality of data lines 171 which each have source electrodes 173, wide end portions 179 and a plurality of drain electrodes 175, a plurality of ohmic contact stripes 161 including protrusions 163, and a plurality of ohmic contact islands 164.

In this case, the photosensitive film is irradiated by using one mask that includes three regions: a translucent region that has a translucency through which the light is partially transmitted, a transparent region, and an opaque region. The photosensitive film is then is developed such that a photosensitive film pattern having two thickness may be formed, such that the channel C of the thin film transistor formed in the protrusion 154 of the semiconductor 151 between the source electrode 173 and the drain electrode 175 may be formed.

Next, referring to FIG. 7, an inorganic insulator is deposited on the data conductor, the exposed protrusion 154 of the semiconductor stripe 151, and the gate insulating layer 140 to form a lower passivation layer 180p. An organic insulator is then deposited on the inorganic insulator to form an upper passivation layer 180q. The organic insulator forming the upper passivation layer 180q may be an organic material that does not include sulfur, and for example may be an organic material that has negative photosensitivity in addition to not including sulfur.

Next, referring to FIG. 8, a photomask (not shown) is positioned on the upper passivation layer 180q, and the upper passivation layer 180q is exposed to, or irradiated with, light and developed to form a plurality of upper contact holes 182q and 185q and a thin portion 183 having a relatively thin thickness.

When the upper passivation layer 180q has negative photosensitivity such that a portion that is irradiated by the light remains, the region A of the photomask is transparent such that the light is transmitted to the upper passivation layer 180q, the region B of the photomask is opaque such that the light is not transmitted to the upper passivation layer 180q, and the region C of the photomask is translucent such that the light is partially transmitted to the upper passivation layer 180q. The upper passivation layer 180q corresponding to the region A at which the light is transmitted remains, the upper passivation layer 180q corresponding to the region B is entirely removed thereby forming the contact holes 182q and 185q, and the upper passivation layer 180q corresponding to the region C is the thin portion 183. On the other hand, when the upper passivation layer 180q has positive photosensitivity such that a portion that is irradiated by the light is removed, the transmittance of the regions A and B of the photomask used is exchanged, so that region A of the photomask is opaque, and the region B is translucent. Region C remains partially translucent. In this case, the upper passivation layer 180q may be made of an organic insulator that does not include sulfur.

Next, referring to FIG. 9, the lower passivation layer 180p is etched by using the upper passivation layer 180q as an etching mask to complete a contact hole 182, that exposes the wide end portion 179 of the data line 171, and a contact hole 185 that exposes the drain electrode 175. Here, the gate insulating layer 140 is also etched to form a contact hole 181 that exposes the wide end portion 129 of the gate line 121.

Plasma etching is used to etch the passivation layer 180 and the gate insulating layer 140. The etching of the lower passivation layer 180p and the gate insulating layer 140 may be executed in a chamber. The etching gas includes a mixture of a fluorine-based gas, which is a gaseous compound that has a fluorine group, such as, for example, sulfur hexafluoride $SF_6$, and oxygen gas $O_2$. The gas in the chamber is changed into a plasma state. To create the plasma, for instance, one electrode of the two electrodes used for the plasma formation may be simultaneously supplied with a source power having a relatively high frequency and a bias power having a lower frequency than that of the source power, and the other electrode may be grounded. In the chamber, the fluorine-based gas and the oxygen gas are changed into plasma, and then the etching process for the thin film transistor array panel is executed.

According to an exemplary embodiment, when the fluorine-based gas is sulfur hexafluoride gas, the flow ratio (sccm) of the sulfur hexafluoride gas to oxygen gas (that is, the ratio of the flow rate in sccm (standard cubic centimeters per minute) of the hexafluoride gas to oxygen gas) may be equal to or greater than 1/7. When the proportion of the fluorine-based gas in the entire etching gas is equal to or more than a predetermined amount (as determined by, for instance, flow rates or pressure), such as the flow ratio (sccm) of the sulfur hexafluoride gas to oxygen gas is equal to or greater than 1/7, fluorine (F) reacts with the copper that may be included in the data conductor and the gate conductor such that copper fluoride ($CuF_2$) may be formed. The copper fluoride that is formed protects the copper in the data conductor and gate conductor, and simultaneously prevents formation of copper sulfide (CuS) when the lower passivation layer 180*p* and the gate insulating layer 140 are etched. Also, when the upper passivation layer 180*q* includes sulfur, sulfur is more easily reacted with fluorine (F) than the copper of the data conductor or the gate conductor, such that a gas such as sulfur monofluoride ($S_2F_2$) or sulfuryl fluoride ($SO_2F_2$) is formed, which can be exhausted to the outside of the chamber. As a result, foreign particles such as copper sulfide may be prevented from forming on the surface of the data conductor and the surface of the gate conductor.

According to another exemplary embodiment, when the lower passivation layer 180*p* or the gate insulating layer 140 are etched to form the contact holes 181, 182, and 185, the pressure of the plasma etching gas (e.g. the mixture of the fluorine-based gas and oxygen gas in the plasma state) inside the chamber may be maintained at equal to or more than 50 mT and equal to or less than 150 mT. As described above, if the pressure of the plasma etching gas is larger than a predetermined pressure (i.e., about 50 mT), even when the upper passivation layer 180*q* includes sulfur, the amount of foreign particles such as particles containing copper sulfide that are formed on the surface of the data conductor or the surface of the gate conductor as the result of sulfur reacting with the copper of the data conductor or the gate conductor may be reduced.

According to another exemplary embodiment, one of the electrodes in the chamber where the etching process is executed is simultaneously supplied with a source power and a bias power, and the ratio of the bias power to the source power supplied to the electrode may be equal to or less than 3. In this way, when, between the source power and the bias power supplied to the electrode in the chamber for formation of plasma, the bias power is less than a predetermined power, or the ratio of the bias power to the source power is equal to or less than a predetermined ratio (for instance, 3), although the upper passivation layer 180*q* includes sulfur, the amount of foreign particles such as particles containing copper sulfide formed on the surface of the data conductor or the surface of the gate conductor by sulfur reacting with the copper of the data conductor or the gate conductor may be reduced. The source power and the bias power may be simultaneously applied to the electrode. In particular, the source power and the bias power may be independently applied to an upper electrode and a lower electrode, or both of the source power and the bias power may be applied to a lower electrode. Next, referring to FIG. 10 and FIG. 11, the whole surface of the upper passivation layer 180*q* is etched through ashing using oxygen plasma, thereby reducing the thickness thereof and removing the thin portion 183 of the upper passivation layer 180*q* to form an opening 187. Opening 187 exposes the lower passivation layer 180*p* on the storage electrode line 131. In this etching, the upper passivation layer 180*q* is etched by the thickness of the thin portion 183 such that the thickness of the upper passivation layer 180*q* is reduced by the amount of the initial thickness of the thin portion 183.

According to an exemplary embodiment, after the ashing process using oxygen plasma, a cleaning process using a stripping agent or hydrogen fluoride (HF) may be performed to remove any foreign particles such as particles containing copper sulfide that may be formed on the data conductor or the gate conductor.

Finally, as shown in FIG. 1 and FIG. 2, ITO or IZO is deposited by sputtering on the upper passivation layer 180*q*, and is patterned by photolithography to form a plurality of pixel electrodes 191 and a plurality of contact assistants 81 and 82.

Through various methods described above, when the upper passivation layer 180*q* includes sulfur, copper that may be included in the data conductor and the gate conductor may be prevented from reacting with sulfur of the upper passivation layer 180*q*. As a result, the formation of foreign particles, such as particles containing copper sulfide, that can form on the surface of the data conductor and the surface of the gate conductor in the process of forming the contact holes 181, 182, and 185, may be prevented. Foreign particles, such as particles containing copper sulfide, which may have been formed in previous steps may be removed through the same methods.

On the other hand, when the upper passivation layer 180*q* is made of an organic insulator that does not include sulfur, formation of foreign particles, such as particles containing copper sulfide, may be prevented at the outset.

As described above, increasing of the contact resistance between the data conductor or the gate conductor, and the pixel electrode 191 and the contact assistants 81 and 82, or contact deterioration therebetween at the contact holes 181, 182, and 185 may be prevented by preventing formation of foreign particles such as particles containing copper sulfide on the surface of the data conductor or the gate conductor.

In an exemplary embodiment, the several methods for preventing the generation of foreign particles such as particles containing copper sulfide on the surface of the signal line such as the data conductor or the gate conductor, or for removing previously formed foreign particles, may be independently used, or two or more of the several methods may be together used.

Next, a thin film transistor array panel according to another exemplary embodiment will be described with reference to FIG. 12. Constituent elements of this exemplary embodiment that were described in the previous exemplary embodiment are indicated by the same reference numerals. Certain redundant description is, therefore, omitted.

Figure 12:
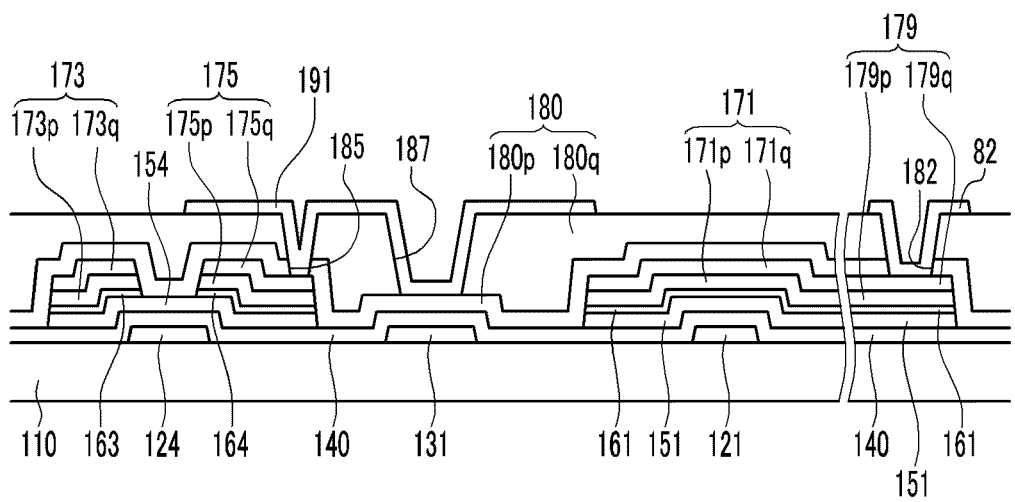
FIG. 12 is a cross-sectional view of a thin film transistor array panel according to another exemplary embodiment.

FIG. 12 is a cross-sectional view of a thin film transistor array panel according to another exemplary embodiment.

A thin film transistor array panel according to the present exemplary embodiment is the same as the thin film transistor array panel of FIG. 1 and FIG. 2, except for the cross-sectional structure of the data conductor.

Referring to FIG. 12, the data line 171 including the source electrode 173 and the wide end portions 179 and the drain electrode 175 include lower conductive layers 171*p*, 173*p*, 175*p*, and 179*p*, and upper conductive layers 171*q*, 173*q*, 175*q*, and 179*q*. The lower conductive layers 171*p*, 173*p*, 175*p*, and 179*p* may be made of a titanium-containing metal such as titanium (Ti) or titanium alloys, a tantalum-containing metal such as tantalum (Ta) or tantalum alloys, a nickel-containing metal such as nickel (Ni) or nickel alloys, a molybdenum-containing metal such as molybdenum (Mo) or molybdenum alloys, a neodymium-containing metal such as neodymium (Nb) or neodymium alloys, a tungsten-containing metal such as tungsten (W) or tungsten alloys, an indium-containing metal such as indium (In) or indium alloys, a tin-containing metal such tin (Sn) or tin alloys, a gold-containing metal such as gold (Au) or gold alloys, or a chromium containing metal such as chromium (Cr) or chromium alloys. Meanwhile, the upper conductive layers 171q, 173q, 175q, and 179q may be made of a conductive material having low resistivity such as copper (Cu).

Another exemplary embodiment different from the exemplary embodiment shown in FIG. 12, is that the gate line 121 that includes the gate electrode 124 and the storage electrode line 131 may have the same cross-sectional structure, i.e. multi layered structure as the data line 171.

The various characteristics and effects, and the manufacturing method of the previous exemplary embodiment, may be applied to this exemplary embodiment shown in FIG. 12.

Next, a thin film transistor array panel according to another exemplary embodiment will be described with reference to FIG. 13 and FIG. 14. Constituent elements of this exemplary embodiment that were described in the previous exemplary embodiment are indicated by the same reference numerals. Certain redundant description is, therefore, omitted.

Figure 13:
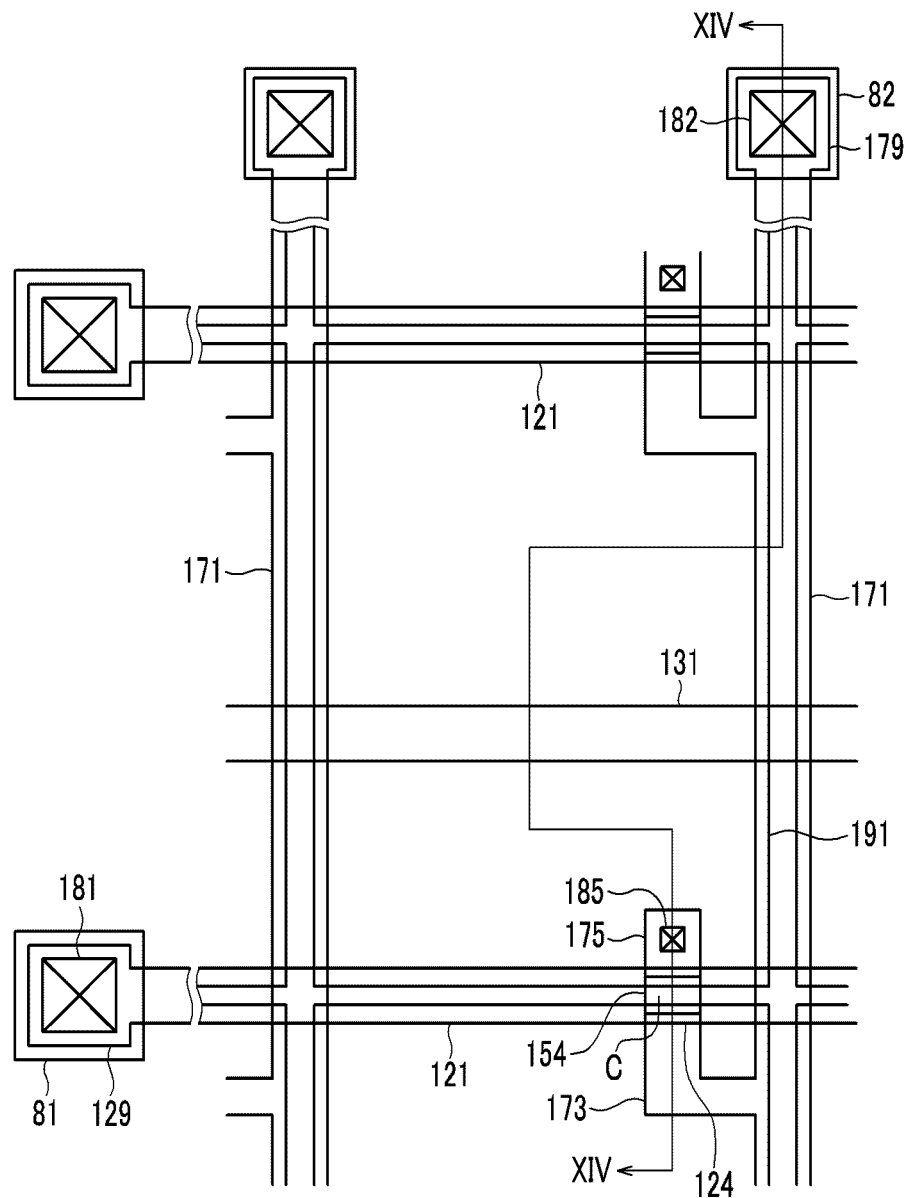
FIG. 13 is a layout view of a thin film transistor array panel according to another exemplary embodiment.
Figure 14:
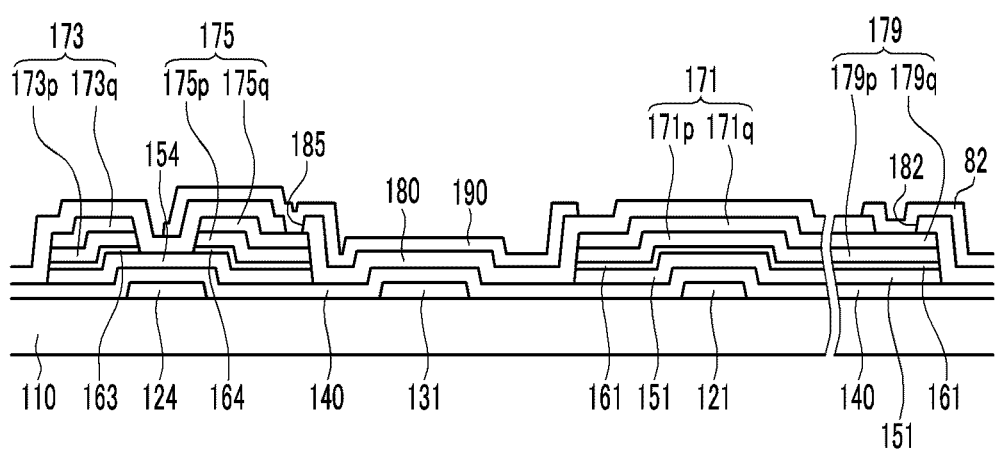
FIG. 14 is a cross-sectional view of the thin film transistor array panel shown in FIG. 13 taken along the line XIV-XIV.

FIG. 13 is a layout view of a thin film transistor array panel according to another exemplary embodiment, and FIG. 14 is a cross-sectional view of the thin film transistor array panel shown in FIG. 13 taken along the line XIV-XIV.

A gate conductor including a plurality of gate lines 121 and storage electrode lines 131 is formed on an insulation substrate 110. The gate conductor may be made of a single layer or multiple layers, and may include copper.

A gate insulating layer 140 is formed on the gate conductor, and a plurality of semiconductor stripes 151 and a plurality of ohmic contact stripes 161 and ohmic contact islands 164 are formed thereon.

A data conductor including a plurality of data lines 171 and a plurality of drain electrodes 175 is formed on the ohmic contacts 161 and 164. The data conductor includes a lower conductive layers 171p, 173p, 175p, and 179p, and upper conductive layers 171q, 173q, 175q, and 179q disposed thereon. The lower conductive layers 171p, 173p, 175p, and 179p may be made of a titanium-containing metal such as titanium (Ti) or titanium alloys, a tantalum-containing metal such as tantalum Ta or tantalum alloys, a nickel-containing metal such as nickel (Ni) or nickel alloys, a molybdenum-containing metal such as molybdenum (Mo) or molybdenum alloys, a neodymium-containing metal such as neodymium (Nb) or neodymium alloys, a tungsten-containing metal such as tungsten (W) or tungsten alloys, an indium-containing metal such as indium (In) or indium alloys, a tin-containing metal such tin (Sn) or tin alloys, a gold-containing metal such as gold (Au) or gold alloys, or a chromium-containing metal such as chromium (Cr) or chromium alloys. The upper conductive layers 171q, 173q, 175q, and 179q may be made of a conductive material having low resistivity such as copper (Cu).

A passivation layer 180 is formed on the gate insulating layer 140, the data line 171, the drain electrode 175, and the exposed protrusions 154 of the semiconductor stripes 151. The passivation layer 180 may be made of the inorganic insulator such as, for example, silicon nitride or silicon oxide. The passivation layer 180 has contact holes 185 and 182 respectively exposing the drain electrode 175 and the wide end portions 179 of the data lines 171. The passivation layer 180 and the gate insulating layer 140 have a contact hole 181 exposing the wide end portions 129 of the gate lines 121.

A plurality of pixel electrodes 191 and a plurality of contact assistants 81 and 82 are formed on the passivation layer 180.

Next, a manufacturing method of a thin film transistor array panel according to an exemplary embodiment will be described with reference to FIG. 15 to FIG. 22 as well as FIG. 13 and FIG. 14. Constituent elements of this exemplary embodiment that were described in the previous exemplary embodiments are indicated by the same reference numerals. Certain redundant description is, therefore, omitted.

Figure 15:
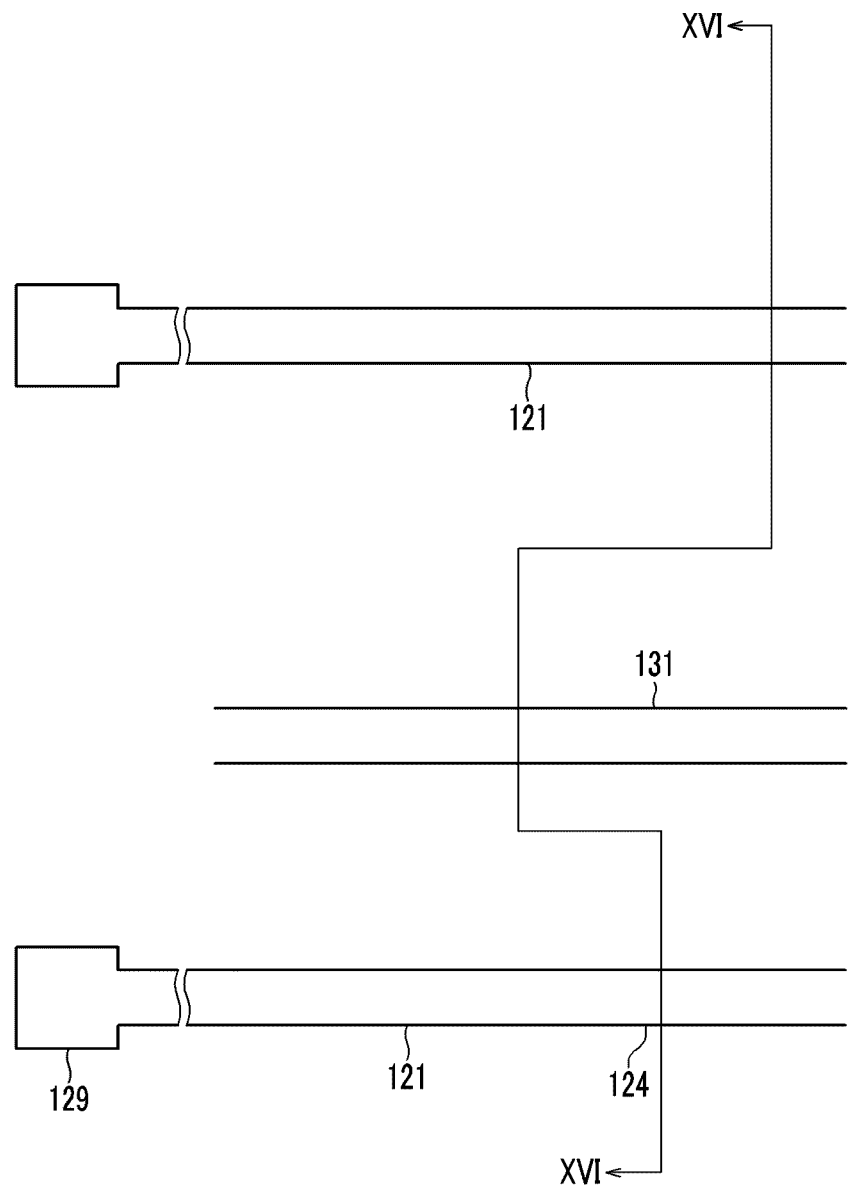
FIG. 15 is a layout view of the thin film transistor array panel shown in FIG. 13 and FIG. 14 at the first step in the manufacturing method according to an exemplary embodiment.
Figure 16:
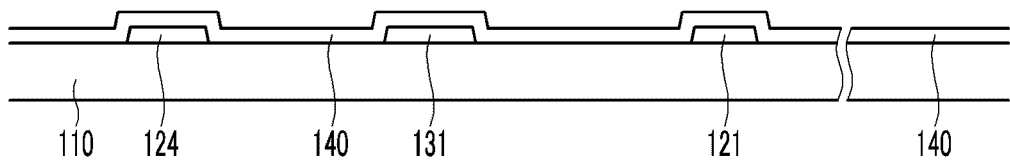
FIG. 16 is a cross-sectional view of the thin film transistor array panel shown in FIG. 15 taken along the line XVI-XVI.
Figure 17:
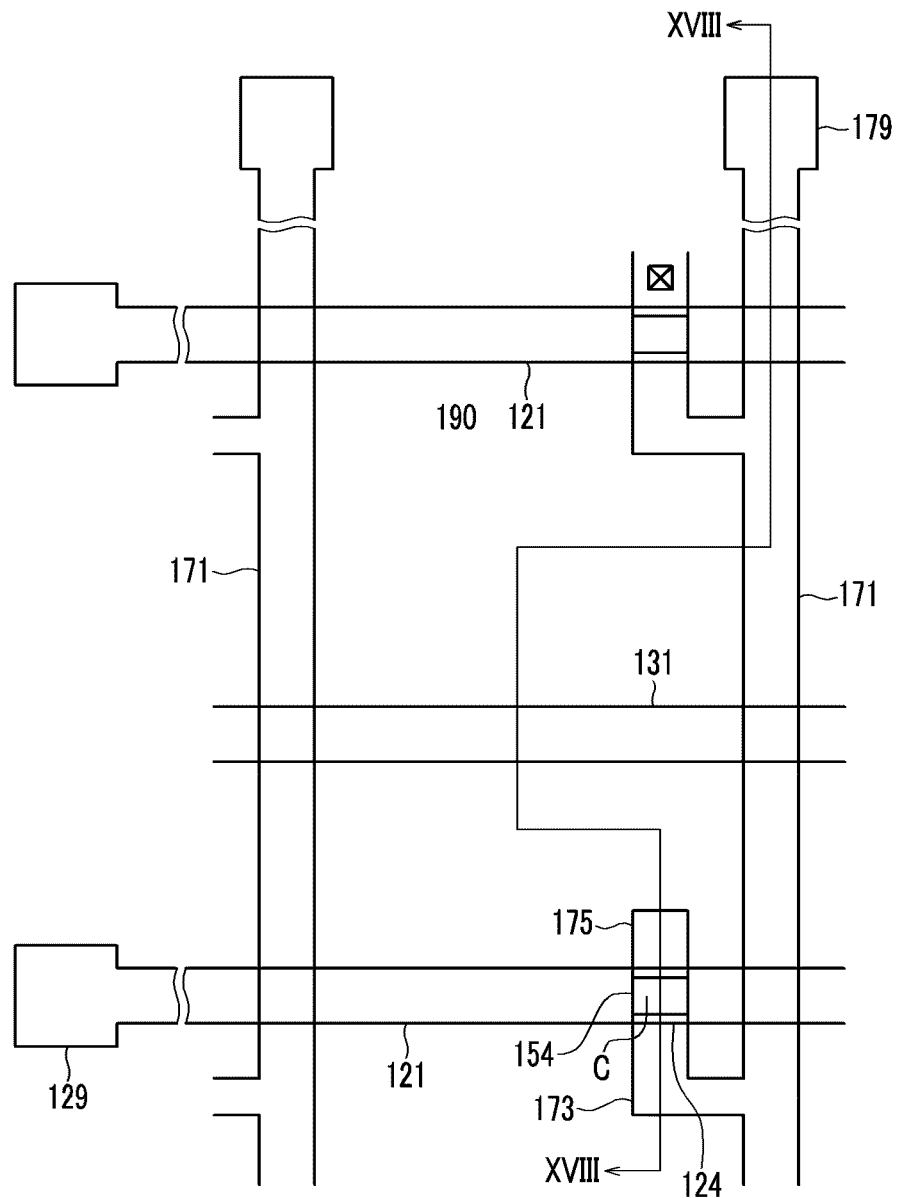
FIG. 17 is a layout view of the thin film transistor array panel shown in FIG. 13 and FIG. 14 at an intermediate step in the manufacturing method according to an exemplary embodiment, showing a step following that of FIG. 15 and FIG. 16.
Figure 18:
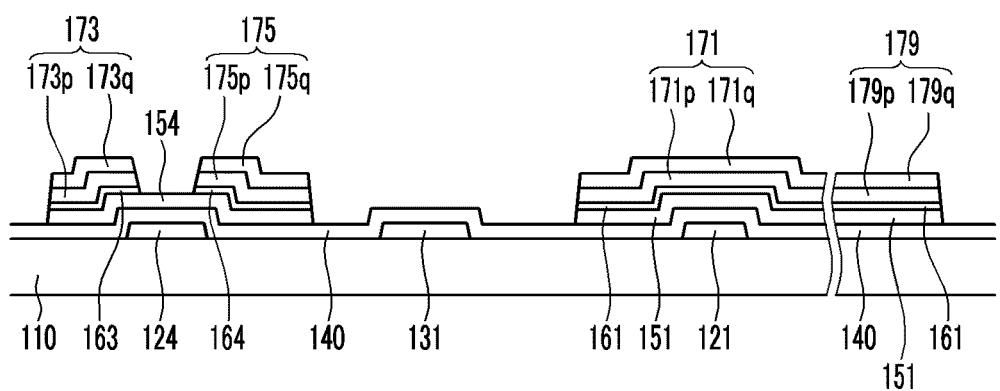
FIG. 18 is a cross-sectional view of the thin film transistor array panel shown in FIG. 17 taken along the line XVIII-XVIII.
Figure 19:
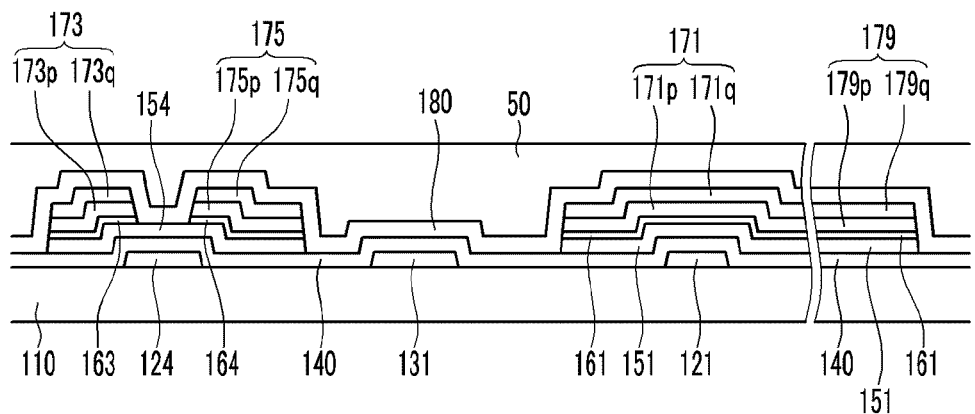
FIG. 19 and FIG. 20 are cross-sectional views of the thin film transistor array panel shown in FIG. 13 and FIG. 14 at an intermediate step in the manufacturing method according to an exemplary embodiment, sequentially showing a step following that of FIG. 17 and FIG. 18.
Figure 20:
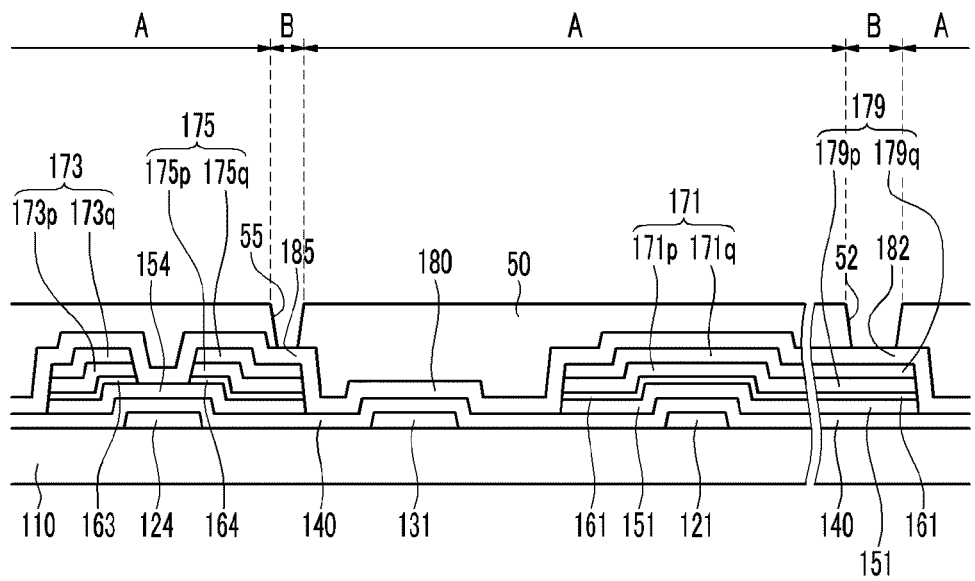
Figure 21:
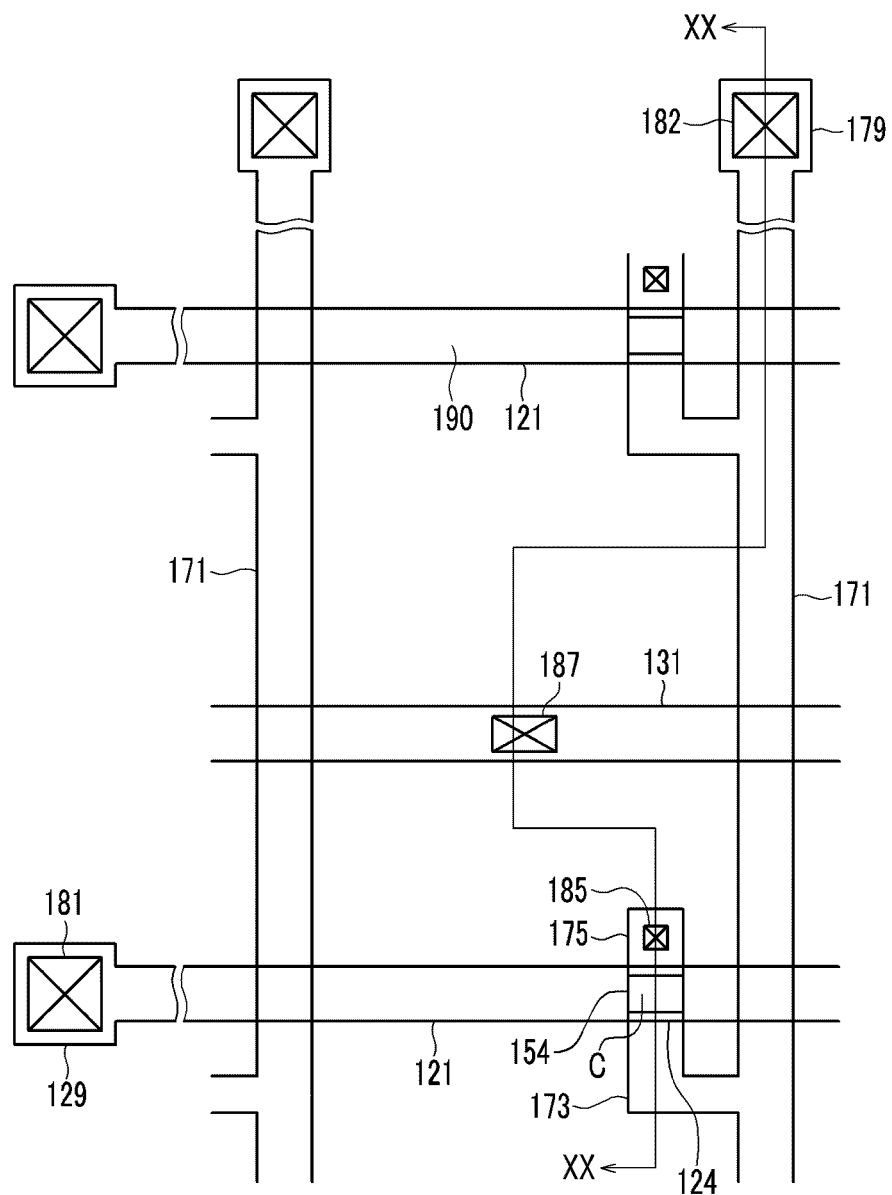
FIG. 21 is a layout view of the thin film transistor array panel shown in FIG. 13 and FIG. 14 at an intermediate step in the manufacturing method according to an exemplary embodiment, showing a step following that of FIG. 20.
Figure 22:
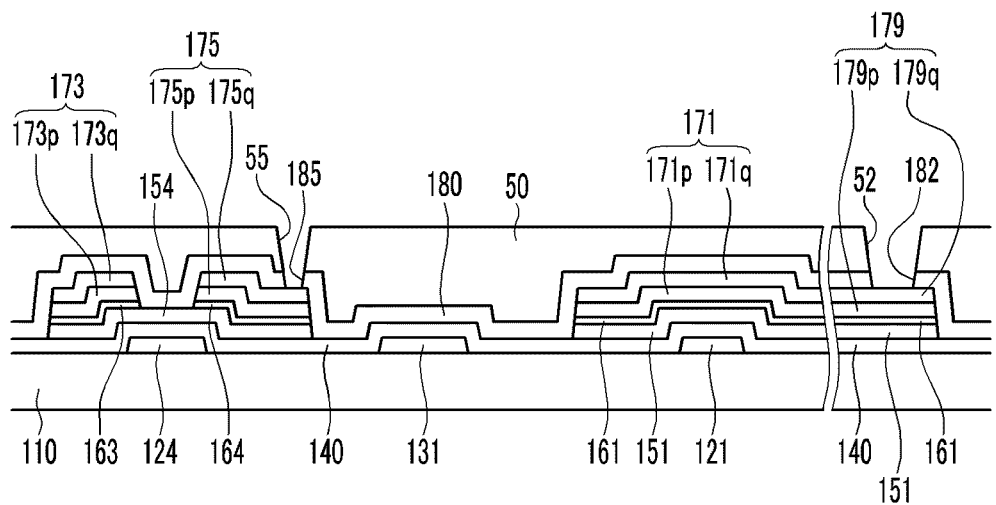
FIG. 22 is a cross-sectional view of the thin film transistor array panel shown in FIG. 21 taken along the line XXII-XXII.

FIG. 15 is a layout view of the thin film transistor array panel shown in FIG. 13 and FIG. 14 at the first step in the manufacturing method according to an exemplary embodiment, FIG. 16 is a cross-sectional view of the thin film transistor array panel shown in FIG. 15 taken along the line XVI-XVI, FIG. 17 is a layout view of the thin film transistor array panel shown in FIG. 13 and FIG. 14 at an intermediate step in the manufacturing method according to an exemplary embodiment, showing a step following that of FIG. 15 and FIG. 16, FIG. 18 is a cross-sectional view of the thin film transistor array panel shown in FIG. 17 taken along the line XVIII-XVIII, FIG. 19 and FIG. 20 are cross-sectional views of the thin film transistor array panel shown in FIG. 13 and FIG. 14 at an intermediate step in the manufacturing method according to an exemplary embodiment, sequentially showing a step following that of FIG. 17 and FIG. 18, FIG. 21 is a layout view of the thin film transistor array panel shown in FIG. 13 and FIG. 14 at an intermediate step in the manufacturing method according to an exemplary embodiment, showing a step following that of FIG. 20, and FIG. 22 is a cross-sectional view of the thin film transistor array panel shown in FIG. 21 taken along the line XXII-XXII.

First, referring to FIG. 15 and FIG. 16, a plurality of storage electrode lines 131 and a gate conductor that includes a plurality of gate lines 121 and gate electrodes 124 are formed on the insulation substrate 110. Next, a gate insulating layer 140 is deposited on the gate conductor.

Next, referring to FIG. 17 and FIG. 18, an intrinsic semiconductor layer (not shown) of amorphous or crystallized silicon, an extrinsic semiconductor layer (not shown) doped with an impurity, and a lower data conductor (not shown) including titanium and an upper data conductor (not shown) are sequentially deposited and patterned by photolithography using a photosensitive film to form a data conductor including a plurality of data lines 171 that include source electrodes 173 and wide end portions 179, and a plurality of drain electrodes 175, a plurality of ohmic contact stripes 161 including protrusions 163, and a plurality of ohmic contact islands 165. The data conductor includes lower conductive layers 171p, 173p, 175p, and 179p, and upper conductive layers 171q, 173q, 175q, and 179q that include copper.

In this case, the photosensitive film is irradiated by using one mask that includes three regions: a translucent region that has a translucency through which the light is partially transmitted, a transparent region, and an opaque region. The photosensitive film is then developed such that a photosensitive film pattern including two regions having different thicknesses may be formed. The channel C of the thin film transistor formed in the protrusion 154 of the semiconductor 151 between the source electrode 173 and the drain electrode 175 may be formed.

Next, referring to FIG. 19, a passivation layer 180 made of an inorganic insulator is deposited on the data conductor, the exposed protrusion 154 of the semiconductor stripe 151, and the gate insulating layer 140 to form a lower passivation layer

180p, and then a photosensitive film is coated thereon. The photosensitive film 50 may be made of a resin that does not include sulfur, and for example, it may be a photosensitive film that has negative photosensitivity.

Next, referring to FIG. 20, a photomask (not shown) is positioned on the photosensitive film 50, and the photosensitive film 50 is exposed and developed to form a plurality of openings 52 and 55.

In this case, when the photosensitive film 50 has negative photosensitivity such that the portion that is irradiated by the light remains, the region A of the photomask is transparent such that the light is transmitted to the photosensitive film 50, and the region B of the photomask is opaque such that light is blocked and is not transmitted to the photosensitive film 50. The photosensitive film 50 disposed on the region A where the light is transmitted remains, and the photosensitive film 50 disposed on the region B is all removed, thereby forming the openings 52 and 55.

Next, referring to FIG. 21 and FIG. 22, the passivation layer 180 is etched using the patterned photosensitive film 50 as an etching mask to form (i) a contact hole 182 exposing the wide end portion 179 of the data line 171, and (ii) a contact hole 185 exposing the portion of the drain electrode 175. The gate insulating layer 140 is also etched to form a contact hole 181 exposing the wide end portion 129 of the gate line 121.

Plasma etching used to etch the passivation layer 180 and the gate insulating layer 140. The etching of the passivation layer 180 and the gate the insulating layer 140 may be executed in a chamber. The etching gas includes a mixture of a fluorine-based gas, which is a gaseous compound that has a fluorine group, such as, for example, sulfur hexafluoride $SF_6$, and oxygen gas $O_2$. One electrode of the two electrodes used for the plasma formation may be simultaneously supplied with a source power having a relatively high frequency and a bias power having a lower frequency than that of the source power, and the other electrode may be grounded. In the chamber, the fluorine-based gas and the oxygen gas are changed into plasma, and then the etching process for the thin film transistor array panel is executed.

According to an exemplary embodiment, when the fluorine-based gas is sulfur hexafluoride gas, the flow ratio (sccm) of the sulfur hexafluoride gas to oxygen gas may be equal to or more than 1/7. When the proportion of the fluorine-based gas in the entire etching gas is equal to or more than a predetermined amount (as determined by, for instance, flow rates or pressure), such as the flow ratio (sccm) of the sulfur hexafluoride gas to oxygen gas may be equal to or more than 1/7, fluorine (F) reacts with copper included in the upper conductive layers 171q, 173q, 175q, and 179q and the gate conductor such that copper fluoride ($CuF_2$) may be formed. The copper fluoride that is formed protects the copper in the upper conductive layers 171q, 173q, 175q, and 179q and the gate conductor, and simultaneously prevents the formation of copper sulfide (CuS) when the passivation layer 180 and the gate insulating layer 140 are etched. Also, when the photosensitive film 50 includes sulfur, sulfur is more easily reacted with fluorine (F) than the copper of the upper conductive layers 171q, 173q, 175q, and 179q and the gate conductor such that a gas such as sulfur monofluoride ($S_2F_2$) or sulfuryl fluoride ($SO_2F_2$) is formed to be exhausted to the outside of the chamber. As a result foreign particles such as particles containing copper sulfide may be prevented from forming on the surface of the upper conductive layers 171q, 173q, 175q, and 179q of the data conductor and the surface of the gate conductor.

According to another exemplary embodiment, when the passivation layer 180 or the gate insulating layer 140 are etched to form the contact holes 181, 182, and 185, the pressure of the plasma gas inside the chamber may be maintained at equal to or more than 50 mT and equal to or less than 150 mT. If the pressure of the etching gas is greater than a predetermined pressure, i.e., 50 mT, then even when the photosensitive film 50 includes sulfur, formation of the foreign particles such as particles containing copper sulfide on the surface of the upper conductive layers 171q, 173q, 175q, and 179q of the data conductor or the surface of the gate conductor by sulfur reacting with the copper of the upper conductive layers 171q, 173q, 175q, and 179q of the data conductor or the gate conductor may be reduced.

According to another exemplary embodiment, the ratio of the bias power to the source power supplied to the electrode in the chamber in which the etching process is executed may be equal to or less than 3. In this way, when, (i) among the source power and the bias power supplied to the electrode in a chamber for formation of plasma, the bias power is less than a predetermined power, or (ii) the ratio of the bias power to the source power is equal to or less than a predetermined ratio, although the photosensitive film 50 includes sulfur, formation of the foreign particles such as particles containing copper sulfide on the surface of the upper conductive layers 171q, 173q, 175q, and 179q of the data conductor or the surface of the gate conductor by sulfur reacting with the copper of the upper conductive layers 171q, 173q, 175q, and 179q of the data conductor or the gate conductor may be reduced.

Finally, the photosensitive film 50 is removed, as shown in FIG. 13 and FIG. 14, and ITO or IZO is deposited by sputtering on the upper passivation layer 180q and patterned by photolithography to form a plurality of pixel electrodes 191 and a plurality of contact assistants 81 and 82.

As described above, when the photosensitive film 50 includes sulfur, copper of the upper conductive layers 171q, 173q, 175q, and 179q of the data conductor or the gate conductor may be prevented from reacting with sulfur of the photosensitive film 50 to form foreign particles, such as particles containing copper sulfide, on the surface of the upper conductive layers 171q, 173q, 175q, and 179q of the data conductor or the surface of the gate conductor in a process of forming the contact holes 181, 182 and 185 through various methods described above, and previously formed foreign particles such as particles containing copper sulfide may also be removed through the same methods.

On the other hand, even when the photosensitive film 50 does not include sulfur, the formation of foreign particles such as particles containing copper sulfide may be prevented at the outset.

As described above, increasing of the contact resistance between the data conductor or the gate conductor, and the pixel electrode 191 and the contact assistants 81 and 82, or contact deterioration therebetween, at the contact holes 181, 182 and 185, may be prevented by preventing formation of foreign particles such as particles containing copper sulfide on the surface of the upper conductive layers 171q, 173q, 175q, and 179q of the data conductor or the gate conductor.

Also, in the present exemplary embodiment, the several methods for preventing the generations of foreign particles such as particles containing copper sulfide on the surface of the signal line such as the data conductor or the gate conductor, or for removing previously formed foreign particles, may be independently used, or two or more of the several methods may be together used.

Next, a thin film transistor array panel according to another exemplary embodiment will be described with reference to FIG. 23. The same constituent elements as of the previous exemplary embodiment are indicated by the same reference numerals, and the same description is omitted.

Figure 23:
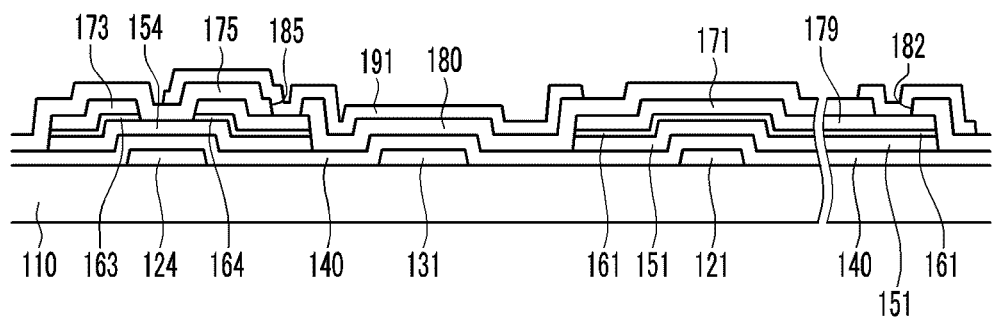
FIG. 23 is a cross-sectional view of a thin film transistor array panel according to another exemplary embodiment.

FIG. 23 is a cross-sectional view of a thin film transistor array panel according to another exemplary embodiment.

A thin film transistor array panel according to the present exemplary embodiment is the same as the thin film transistor array panel of FIG. 13 and FIG. 14, except for the cross-sectional structure of the data conductor.

In the present exemplary embodiment, a data conductor including the data line 171 that includes the source electrode 173 and the wide end portion 179, and the drain electrode 175, is formed of a single layer that includes copper.

Figure 24:
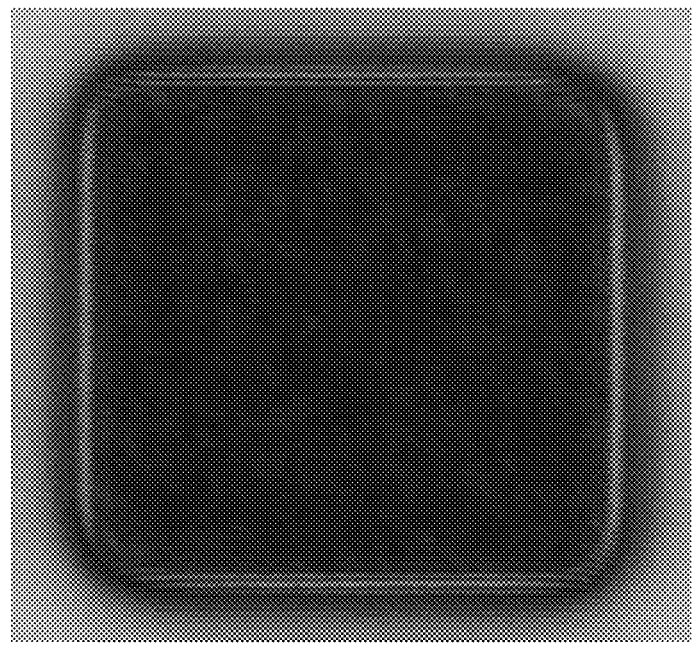
FIG. 24 is a photograph showing a surface of a signal line such as a data conductor or a gate conductor at a contact hole according to conventional art.
Figure 25:
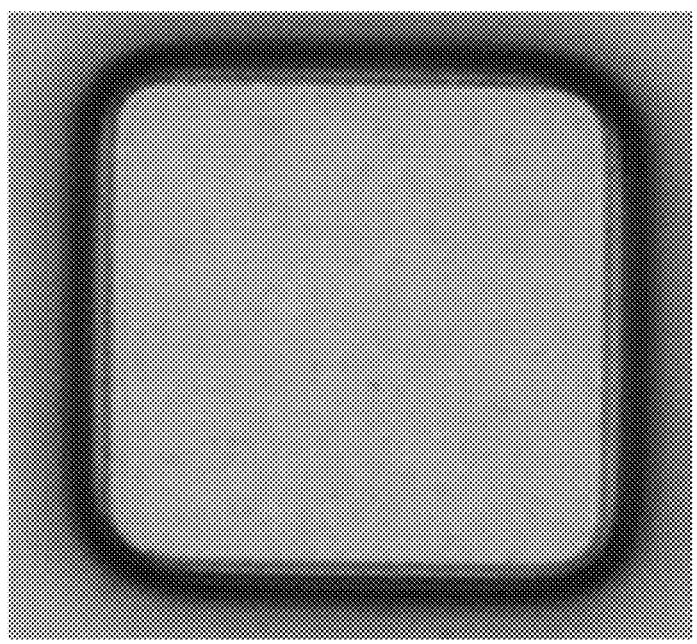
FIG. 25 is a photograph showing a surface of a signal line such as a data conductor or a gate conductor at a contact hole according to several exemplary embodiments.

FIG. 24 is a photograph showing a surface of a signal line such as a data conductor or a gate conductor at a contact hole according to the of conventional art, and FIG. 25 is a photograph showing a surface of a signal line such as a data conductor or a gate conductor at a contact hole according to an exemplary embodiment.

Referring to FIG. 24, in the contact hole according to conventional art, the color of the surface of the signal lines such as the data conductor or the gate conductor is changed by foreign particles, that is, the darkened color on the surface shown in FIG. 24 indicates that foreign particles have formed on the surface of the data conductor or gate conductor in the contact whole. On the other hand, referring to FIG. 25, in the case of the manufacturing method of the thin film transistor array panel according to an exemplary embodiment, the foreign particles are not generated at the surface of the signal lines such as the data conductor or gate conductor in the contact hole such that the color is not changed. The results are the same as those illustrated in FIG. 25 using the various exemplary embodiments described herein.

According to an exemplary embodiment, by preventing generation of the foreign particles such as particles containing copper sulfide (CuS) at the surface of the data conductor or the gate conductor, increasing of the amount of contact resistance between the data conductor or the gate conductor and other layers, or contact deterioration therebetween, may be prevented at the contact holes of the passivation layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a substrate:
a signal line disposed on the substrate and including copper (Cu);
a passivation layer disposed on the signal line and having a contact hole exposing a portion of the signal line; and
a conductive layer disposed on the passivation layer and connected to the portion of the signal line through the contact hole,
wherein the passivation layer includes an organic passivation layer that includes an organic insulator that does not include sulfur, the organic passivation layer including an alkali soluble resin and a photosensitizer, the photosensitizer including at least one of a 2-(4-methoxyphenyl)-4 derivative and a halomethylated triazin derivative.

2. The thin film transistor array panel of claim 1, wherein the organic passivation layer has negative photosensitivity.

3. The thin film transistor array panel of claim 1, wherein the passivation layer further includes an inorganic passivation layer disposed under the organic passivation layer and including an inorganic insulator.

4. The thin film transistor array panel of claim 1, wherein the signal line includes a lower conductive layer and an upper conductive layer,
the upper conductive layer includes copper, and
the lower conductive layer includes at least one of titanium (Ti), tantalum (Ta), nickel (Ni), molybdenum (Mo), neodymium (Nb), tungsten (W), indium (In), tin (Sn), gold (Au), and chromium (Cr).

5. The thin film transistor array panel of claim 1, further comprising
a gate insulating layer formed on the substrate,
the signal line includes a gate line disposed under the gate insulating layer, and
the contact hole is extended through the gate insulating layer.

6. The thin film transistor array panel of claim 2, wherein the passivation layer further includes an inorganic passivation layer disposed under the organic passivation layer and including an inorganic insulator.

7. A method for manufacturing a thin film transistor array panel, comprising:
forming a signal line including copper on a substrate;
depositing a first passivation layer on the signal line;
coating an organic material layer including an organic material having photosensitivity on the first passivation layer;
irradiating light to the organic material layer through a mask to pattern the organic material layer, after patterning, a portion of the first passivation layer is exposed, and a first portion of the organic material layer has a thinner thickness than a remaining portion of the organic material layer;
forming a contact hole exposing a portion of the signal line in the first passivation layer by using the patterned organic material layer as an etching mask; and
forming a conductive layer connected to the signal line through the contact hole,
wherein the forming of the contact hole comprises using a first etching gas including a fluorine-based gas and a second etching gas including oxygen gas, and
the flow ratio (sccm) of the first etching gas to the second etching gas is more than 1/7.

8. The method of claim 7, wherein the first etching gas includes sulfur hexafluoride ($SF_6$).

9. The method of claim 7, wherein
the signal line includes a lower conductive layer and an upper conductive layer,
the upper conductive layer includes copper, and
the lower conductive layer includes at least one of titanium (Ti), tantalum (Ta), nickel (Ni), molybdenum (Mo), neodymium (Nb), tungsten (W), indium (In), tin (Sn), gold (Au), and chromium (Cr).

10. The method of claim 7, further comprising
removing the organic material layer.

11. The method of claim 7, wherein
the organic material layer forms a second passivation layer disposed under the conductive layer.

12. The method of claim 7, wherein
the mask is a photomask includes a transparent region through which light is transmitted, an opaque region at which light is blocked, and a translucent region through which light is partially transmitted, and
wherein the first portion of the organic material layer corresponds to the translucent region of the photomask.

13. The method of claim 12, further comprising
ashing the organic material layer to remove the first portion.

14. The method of claim 13, wherein
the ashing to remove the first portion comprises using oxygen plasma gas.

15. The method of claim 14, further comprising
cleaning by using a cleaning material including a stripping agent or hydrogen fluoride (HF) after the ashing to remove the first portion.

16. A method for manufacturing a thin film transistor array panel, comprising:
forming a signal line including copper on a substrate;
depositing a first passivation layer on the signal line;
coating an organic material layer including an organic material having photosensitivity on the first passivation layer;
irradiating light to the organic material layer through a mask to pattern the organic material layer;
forming a contact hole exposing a portion of the signal line in the first passivation layer by using the patterned organic material layer as an etching mask; and
forming a conductive layer connected to the signal line through the contact hole,
wherein the forming of the contact hole is executed in a chamber including an electrode for forming a plasma gas, and
the electrode is supplied with a source power and a bias power, and
a ratio of the bias power to the source power is equal to or less than 3.

17. A method for manufacturing a thin film transistor array panel, comprising:
forming a signal line including copper on a substrate;
depositing a first passivation layer on the signal line;
coating an organic material layer including an organic material having photosensitivity on the first passivation layer;
irradiating light to the organic material layer through a mask to pattern the organic material layer, after patterning, a portion of the first passivation layer is exposed, and a first portion of the organic material layer has a thinner thickness than a remaining portion of the organic material layer;
forming a contact hole exposing a portion of the signal line in the first passivation layer by using the patterned organic material layer as an etching mask;
ashing to remove a portion of the organic material layer;
cleaning the exposed portion of the signal line by using a cleaning material including a stripping agent or hydrogen fluoride (HF), and
forming a conductive layer connected to the signal line through the contact hole.

18. The method of claim 17, wherein
the ashing comprises using oxygen plasma gas.

* * * * *